(12) United States Patent
Markanday et al.

(10) Patent No.: US 12,419,196 B2
(45) Date of Patent: Sep. 16, 2025

(54) PIEZOELECTRIC COMPOSITION AND FILMS WITH HIGH D33 VALUES AND IMPROVED ADHESION AND FLEXIBILITY

(71) Applicant: SABIC Global Technologies B.V., Bergen op Zoom (NL)

(72) Inventors: Meghna Markanday, Bangalore (IN); Pradeep Singh, Bangalore (IN); Venkata Ramanarayanan Ganapathy Bhotla, Bangalore (IN); Arun Kumar Sikder, Bangalore (IN)

(73) Assignee: SABIC GLOBAL TECHNOLOGIES B.V., Bergen op Zoom (NL)

( * ) Notice: Subject to any disclaimer, the term of this patent is extended or adjusted under 35 U.S.C. 154(b) by 762 days.

(21) Appl. No.: 17/596,752

(22) PCT Filed: Jun. 18, 2020

(86) PCT No.: PCT/IB2020/055720
§ 371 (c)(1),
(2) Date: Dec. 17, 2021

(87) PCT Pub. No.: WO2020/255024
PCT Pub. Date: Dec. 24, 2020

(65) Prior Publication Data
US 2022/0254986 A1    Aug. 11, 2022

Related U.S. Application Data

(60) Provisional application No. 62/862,705, filed on Jun. 18, 2019.

(51) Int. Cl.
*H10N 30/85* (2023.01)
*C08J 5/18* (2006.01)
*C08L 27/16* (2006.01)

(52) U.S. Cl.
CPC .............. *H10N 30/852* (2023.02); *C08J 5/18* (2013.01); *C08L 27/16* (2013.01); *C08J 2327/16* (2013.01); *C08J 2423/08* (2013.01); *C08L 2203/16* (2013.01); *C08L 2203/20* (2013.01)

(58) Field of Classification Search
CPC ....... H10N 30/852; C08J 5/18; C08J 2327/16; C08J 2423/08; C08L 27/16; C08L 2203/16; C08L 2203/20
See application file for complete search history.

(56) References Cited

U.S. PATENT DOCUMENTS

| 4,595,515 A * | 6/1986 | Wakino ................ G10K 11/165 310/326 |
| 9,290,587 B2 | 3/2016 | Bauer |
| 9,732,175 B2 | 8/2017 | Lin et al. |
| 2011/0016885 A1 * | 1/2011 | Zhang ..................... F25B 21/00 62/3.1 |
| 2012/0178880 A1 | 7/2012 | Zhang et al. |
| 2015/0134061 A1 | 5/2015 | Friis et al. |
| 2015/0287906 A1 | 10/2015 | Zhang et al. |
| 2015/0307673 A1 | 10/2015 | Domingues Dos Santos et al. |
| 2016/0076798 A1 | 3/2016 | Zhang et al. |
| 2016/0087185 A1 | 3/2016 | Cheng |
| 2016/0215133 A1 | 7/2016 | Bonnet et al. |
| 2016/0215134 A1 | 7/2016 | Bonnet et al. |
| 2017/0141291 A1 * | 5/2017 | Aliane ................. H10N 30/077 |
| 2017/0306190 A1 | 10/2017 | Garcia-Miralles et al. |
| 2017/0355870 A1 | 12/2017 | Domingues Dos Santos et al. |

FOREIGN PATENT DOCUMENTS

| CN | 104409626 | 3/2015 |
| EP | 0897675 | 2/1999 |
| FR | 2967149 A1 | 5/2012 |

OTHER PUBLICATIONS

Chu, B. et al, "Enhancement of dielectric energy density in the poly(vinylidene fluoride)-based terpolymer/copolymer blends", *Applied Physics Letters*, 93(15):1-3, 2008.

Chu, B. et al, "Interfaces in poly(vinylidene fluoride) terpolymer/Zr02 nanocomposites and their effect on dielectric properties", *Journal of Applied Physics*, 105(1):1-5, 2009.

Zhang, S. et al, "Microstructure and electromechanical responses in semicrystalline ferroelectric relaxor polymer blends", *Journal of Applied Physics*, 100(4): 10.1063/1.2335778, 2006.

Chu, B., "PVDF-Based copolymers, terpolymers and their multi-component material systems for capacitor applications (PHD Thesis)", *The Pennsylvania State University Dept. of Materials Science and Engineering*, 2008.

Prateek et al., "Recent Progress on Ferroelectric Polymer-Based Nanocomposites for High Energy Density Capacitors: Synthesis, Dielectric Properties, and Future Aspects.", *Chemical Reviews*, 116(7): 4260-4317, 2016.

International Search Report and Written Opinion issued for PCT/IB2020/055720, mailed Apr. 8, 2020.

Office Action issued in corresponding Chinese Application No. 202080058485.3, dated Jan. 16, 2025.

\* cited by examiner

*Primary Examiner* — Andrew J. Oyer
(74) *Attorney, Agent, or Firm* — NORTON ROSE FULBRIGHT US LLP

(57) ABSTRACT

Disclosed are piezoelectric compositions and films with high D33 values and improved surface smoothness, scratch resistance and/or adhesion. The compositions and films can have a combination of benefits over the prior art compositions and films by having two different polymers (i.e., EVA and PVDF-TrFE-CFE) blended into a polymer matrix, to which is added piezoelectric additives like PZT, BaTiO3, etc. at greater than 70-90 wt. % loading. Devices utilizing the compositions and films are also disclosed. Such devices can include sensors, transducers, actuators, or wearable devices.

20 Claims, No Drawings

PIEZOELECTRIC COMPOSITION AND FILMS WITH HIGH D33 VALUES AND IMPROVED ADHESION AND FLEXIBILITY

CROSS-REFERENCE TO RELATED APPLICATIONS

This application is a national phase application under 35 U.S.C. § 371 of International Application No. PCT/IB2020/055720 filed Jun. 18, 2020, which claims the benefit of priority of U.S. Provisional Patent Application No. 62/862,705 filed Jun. 18, 2019, which are hereby incorporated by reference in their entirety.

BACKGROUND

A. Field of the Invention

The invention relates to novel piezoelectric compositions and films with high D33 values and improved adhesion and flexibility.

B. Description of Related Art

Piezoelectric behavior has been known for years. Piezoelectric ceramics are often blended into polyvinylidene difluoride ("PVDF") based materials to create a piezoelectric composite film. Typically, such films are developed to be integrated with devices, such as sensors, transducers, actuators or wearables. This is done either by spin-coating a solution onto the device with electrodes, or adhering the freestanding piezoelectric film to the device by various techniques like cold pressing, hot pressing, etc. Thus, it is critical for films to have good surface properties along with adherence to device surfaces.

SUMMARY

Polyvinylidene fluoride triflouroethylene chlorotrifluoroethylene terpolymer ("PVDF-TrFE-CFE"), is one of the fluorinated polymers from the PVDF family with excellent piezoelectric properties, having excellent transfer of charge from polymer to piezoelectric ceramic during poling, thereby maximizing d33 values. Ethylene vinyl acetate ("EVA") is a very soft polymer with flexibility, impact/puncture resistance, excellent adhesion, and hot-melt adhesive glue properties. The current invention utilizing a blend of these two, joining the well-established advantages of PVDF-TrFE-CFE with those of EVA to create a polymer matrix. This polymer matrix is combined with a piezoelectric additive and then turned into a film, the film having piezoelectric properties.

The piezoelectric charge constant, d33, for PVDF-TrFE-CFE blended with 50 wt. % PZT is around 55 pC/N, while for compositions with 1-5 wt. % EVA added to the polymer matrix, the d33 is in the range of 48-50 pC/N. Thus, addition of EVA is not seen to compromise the d33 value seen in PVDF-TrFE-CFE composite films.

The inventive films created showed a combination of benefits over the prior art from having the two different polymers (i.e., EVA and PVDF-TrFE-CFE) blended into a polymer matrix, to which is added piezoelectric additives like PZT, BaTiO$_3$, etc. at greater than 50 wt. % loading. To wit, the inventive film delivers improved surface smoothness, scratch resistance and adhesion.

In some embodiments, a piezoelectric composition comprising a combination of a fluorinated polymer and EVA to create a polymer matrix, to which is added a piezoelectric additive. The fluorinated polymer can be PVDF, and more preferably PVDF-TrFE-CFE. The piezoelectric additive can include one or more from the group comprising PZT, BaTiO$_3$ and KNLN. The piezoelectric additive can comprise 10-90 wt. % of the blend, or more preferably 80-90 wt. %. The EVA can comprise 1-99 wt. % of the polymer matrix, and more preferably 1-5 wt. % or any amount (e.g., 1 wt. %, 2 wt. %, 3 wt. %, 4 wt. %, or 5 wt. %) or range (e.g., 1 to 4 wt. %, 1 to 3 wt. %, 1 to 2 wt. %, 2 to 5 wt. %, 2 to 4 wt. %, 2 to 3 wt. %, 3 to 5 wt. %, 3 to 4 wt. %, or 4 to 5 wt. %) therein.

In another embodiment, a device comprises a piezoelectric composition, the composition comprising a fluorinated polymer, ethylene-vinyl acetate (EVA), the EVA and fluorinated polymer comprising a polymer matrix, and, a piezoelectric additive, and wherein the device is selected from a group comprising a sensor, a transducer, an actuator or a wearable device.

The following includes definitions of various terms and phrases used throughout this specification.

The terms "about" or "approximately" are defined as being close to as understood by one of ordinary skill in the art. In one non-limiting embodiment, the terms are defined to be within 10%, preferably within 5%, more preferably within 1%, and most preferably within 0.5%.

The terms "wt. %", "vol. %", or "mol. %" refers to a weight percentage of a component, a volume percentage of a component, or molar percentage of a component, respectively, based on the total weight, the total volume of material, or total moles, that includes the component. In a non-limiting example, 10 grams of component in 100 grams of the material is 10 wt. % of component.

The term "substantially" and its variations are defined to include ranges within 10%, within 5%, within 1%, or within 0.5%.

The terms "inhibiting" or "reducing" or "preventing" or "avoiding" or any variation of these terms, when used in the claims and/or the specification includes any measurable decrease or complete inhibition to achieve a desired result.

The term "effective," as that term is used in the specification and/or claims, means adequate to accomplish a desired, expected, or intended result.

The use of the words "a" or "an" when used in conjunction with any of the terms "comprising," "including," "containing," or "having" in the claims, or the specification, may mean "one," but it is also consistent with the meaning of "one or more," "at least one," and "one or more than one."

The words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, unrecited elements or method steps.

The inventive compositions can "comprise," "consist essentially of," or "consist of" particular ingredients, components, compositions, etc. disclosed throughout the specification. With respect to the transitional phrase "consisting essentially of," in one non-limiting aspect, a basic and novel characteristic of the compositions and films of the present invention is that they have piezoelectric properties as well as improved surface smoothness, scratch resistance, and/or adhesion characteristics.

In the context of the present invention, at least twenty embodiments are now described Embodiment 1 is piezoelectric composition. The piezoelectric composition includes a fluorinated polymer; ethylene-vinyl acetate (EVA), the EVA and fluorinated polymer comprising a polymer matrix, and, a piezoelectric additive. Embodiment 2 is the composition of embodiment 1, wherein the fluorinated polymer is a member of the polyvinyl difluoride (PVDF) family. Embodiment 3 is the composition of embodiment 2, wherein the PVDF is PVDF-TrFE-CFE. Embodiment 4 is the composition of embodiment 1, wherein the piezoelectric additive includes one or more selected from the group of: PZT, $BaTiO_3$ or KNLN. Embodiment 5 is the composition of embodiment 1 wherein the weight percentage of EVA in the polymer matrix is 1-99 wt. %. Embodiment 6 is the composition of embodiment 5 wherein the weight percentage of EVA in the polymer matrix is 1-5 wt. %. Embodiment 7 is the composition of embodiment 1, wherein the piezoelectric additive is included as 10-70 wt. % of said composition. Embodiment 8 is the composition of embodiment 1, wherein the piezoelectric additive is included as 70-90 wt. % of said composition. Embodiment 9 is the composition of embodiment 2, wherein the piezoelectric additive includes one or more selected from the group of: PZT, $BaTiO_3$ and KNLN. Embodiment 10 is the composition of embodiment 3, wherein the piezoelectric additive includes one or more selected from the group of: PZT, $BaTiO_3$ and KNLN. Embodiment 11 is the composition of embodiment 3, wherein the piezoelectric additive is 10-70 wt. % of said composition. Embodiment 12 is the composition of embodiment 3, wherein the piezoelectric additive comprises 70-90 wt. % of said composition. Embodiment 13 is the composition of embodiment 2, wherein the weight percentage of EVA in the polymer matrix is 1-99 wt. %. Embodiment 14 it the composition of embodiment 3, wherein the weight percentage of EVA in the polymer matrix is 1-99 wt. %. Embodiment 15 is the composition of embodiment 3, wherein the piezoelectric additive includes one or more selected from the group of: PZT, $BaTiO_3$ and KNLN; and, wherein the weight percentage of EVA mixed with the fluorinated polymer is 1-99 wt. %. Embodiment 16 is the composition of embodiment 15, wherein the weight percentage of EVA in the polymer matrix is 1-5 wt. %. Embodiment 17 is the composition of embodiment 3, wherein the piezoelectric additive is 10-70 wt. % of said composition, and, wherein the weight percentage of EVA in the polymer matrix is 1-99 wt. %. Embodiment 18 is the composition of embodiment 17, wherein the weight percentage of EVA in the polymer matrix is 1-5 wt. %. Embodiment 19 is a piezoelectric composition including PDVF-TrFE-CFE; ethylene-vinyl acetate (EVA), wherein the EVA and PDVF-TrFE-CFE together comprising a polymer matrix, the EVA containing 1-5 wt. % of the polymer matrix; and a piezoelectric additive, wherein the piezoelectric additive comprising 70-90 wt. % of the composition. Embodiment 20 provides a device containing a piezoelectric composition, the composition including a fluorinated polymer, ethylene-vinyl acetate (EVA), the EVA and fluorinated polymer comprising a polymer matrix, and, a piezoelectric additive. The device is selected from a group comprising a sensor, a transducer, an actuator or a wearable device.

Other objects, features and advantages of the present invention will become apparent from the following figures, detailed description, and examples. It should be understood, however, that the figures, detailed description, and examples, while indicating specific embodiments of the invention, are given by way of illustration only and are not meant to be limiting. Additionally, it is contemplated that changes and modifications within the spirit and scope of the invention will become apparent to those skilled in the art from this detailed description. In further embodiments, features from specific embodiments may be combined with features from other embodiments. For example, features from one embodiment may be combined with features from any of the other embodiments. In further embodiments, additional features may be added to the specific embodiments described herein.

DETAILED DESCRIPTION

In one aspect, the present invention concerns a mechanically flexible piezoelectric composite film based on a PVDF-TrFE-CFE/EVA blend that exhibits retention of piezoelectric performance with improved surface/mechanical properties.

The invention can include blending EVA copolymer with PVDF-TrFE-CFE and using it as a base matrix for mixing with piezoelectric ceramic filler to prepare a piezoelectric composite film. This allows for better mechanical and piezoelectric properties of the piezoelectric composites, wherein the EVA polymer can play a role in enhancing the mechanical properties while retaining higher piezoelectric properties that seen before addition of EVA. The amount of EVA in the blend can be anywhere from 1-99 weight %, more preferably from 1-5 weight %. A blend of just the two polymers could be manufactured and sold as a product, ready for addition of a piezoelectric additive. A sellable blend could also already have the ceramic added.

The piezoelectric additive could include $BaTiO_3$, PZT, and other piezoelectric additives known in the art to have piezoelectric properties of interest. One could also use a mixture of more than one different piezoelectric additive. The total amount of piezoelectric additives could comprise 10-90 wt. % of the final product, more preferably 80-90 wt. %. Once the piezoelectric additives are blended into the polymer blend, this blend of polymers and piezoelectric additives could be used or sold in this form.

In a preferred embodiment, the blend of polymers and piezoelectric additive is then processed into a thin film. This can be done in any number of ways that are known in the art, including but not limited to solution casting, melt processing and spin coating. A final thickness of the film can be 30-120 microns, though thickness can of course be higher or lower than this range.

It was found in testing that the addition of 1-5 wt. % of EVA to PVDF-TrFE-CFE did not reduce the d33 values significantly. It was also found that the addition of EVA provided better wettability of the piezoelectric additives into the blend, as well as improving surface properties (like scratch, mar, etc.), flexibility and adhesion. This improvement in adhesion can help in easier integration of freestanding films with the final device.

EXAMPLES

The present invention will be described in greater detail by way of specific examples. The following examples are offered for illustrative purposes only, and are not intended to limit the invention in any manner. Those of skill in the art will readily recognize a variety of noncritical parameters which can be changed or modified to yield essentially the same results.

Non-limiting details of fabrication, characterization and performance of the PVDF-TrFE-CFE based piezoelectric films are provided below.

Example 1

Piezoelectric Film Fabrication

Solution cast films were made by using PVDF-TrFE-CFE & EVA as polymers and PZT as ceramic filler with THF as solvent. Desired amount of PVDF-TrFE-CFE and EVA was weighed and dissolved in THF to make 10 wt/wt. % solution with constant stirring. PZT was added to this polymer solution and stirred further. This solution was then casted with a doctor blade as a thin film on a glass plate.

The obtained films were annealed at 110° C. for 5 hours followed by poling as usually done for piezoelectric films. The samples were poled at 110° C. for 30 minutes under 10 KV/mm electric field strength. A list of samples prepared for testing is shown below in Table 1.

TABLE 1

| Sam ple # | Sample Code | Polymer 1 (PVDF-TrFE-CFE) wt/wt % | Polymer 2 EVA wt/wt % | PZT (wt/wt %) | Remarks |
|---|---|---|---|---|---|
| 1 | PEV-1 | 20 | — | 80 | 100% PVDF-TrFE-CFE |
| 2 | PEV-2 | 19 | 1 | 80 | PVDF-TrFE-CFE + EVA |
| 3 | PEV-3 | 15 | 5 | 80 | Blends (EVA wt. % is added w.r.t. PVDF-TrFe-CFE wt. %) |
| 4 | PEV-4 | — | 40 | 60 | 100% EVA Blends |
| 5 | PEV-5 | — | 20 | 80 | |

Example 2

Piezoelectric Material Characterization

SEM study of the samples was carried out using ZEISS EVO-18 scanning electron microscope. SEM images were taken under secondary electron mode with operating voltage of 10 kV. All the samples were air cleaned and coated with 10 nm gold prior to imaging. The images obtained in SEM shows a clear difference in the morphology by adding EVA in the composite film. The addition of EVA shows a network structure on the surface which was not present in piezoelectric films without EVA. This network structure may assist with better mechanical properties.

Example 3

Piezoelectric Properties

The piezoelectric constant (d33–pC/N) is measured by Piezotest piezometer with operating frequency of 110 Hz. The dynamic force applied during measurement was 0.25 N. Piezometer measurements are given in Table 2.

TABLE 2

| S. No. | Sample Composition | Sample Code | d33 (pC/N) | Capacitance (pF) | Tan δ |
|---|---|---|---|---|---|
| 1 | PVDF-TrFE-CFE (20 wt. %) + PZT ((80 wt. %) | PEV-1 | 55 | 65-75 | 0.0630 |
| 2 | [PVDF-TrFE-CFE (19 wt. %) + 1 wt. % EVA + 80 wt. % PZT | PEV-2 | 52-55 | 84 | 0.02 |
| 3 | [PVDF-TrFE-CFE (15 wt. %) + 5 wt. % EVA + 80 wt. % PZT | PEV-3 | 48-50 | 106 | 0.06 |
| 4 | EVA (20 wt. %) + PZT (80 wt. %) | PEV-5 | 5 | 24.5 | 0.0016 |

The values of d33 (pC/N) for the samples measured with the piezometer do not reflect a negative effect on piezoelectric properties of the composite due to addition of EVA.

Nanoindentation Results:

Mechanical properties (modulus and hardness) was measured by using the Nano-Indenter® XP(Keysight Technologies, Inc., Santa Rosa, CA). On each sample, 10 indents were made and average values were calculated as per Olivier and Pharr method. The average value and it's standard deviation is given in Table 3.

TABLE 3

Mechanical properties measured from nano-indentation

| Sample | Modulus (GPa) | STDEV | Range (Mod) | Hardness (GPa) | STDEV | Range(Hard) |
|---|---|---|---|---|---|---|
| PVDF-TrFE-CFE (20 wt. %) + 80 wt. % PZT | 3.15 | 2.33 | 1.8-6.4 | 0.065 | 0.053 | 0.04-0.14 |
| PVDF-TrFE-CFE (19 wt. %) + 80 wt. % PZT + 1 wt. % EVA | 1.57 | 0.57 | 1.1-2.37 | 0.04 | 0.03 | 0.02-0.1 |
| PVDF-TrFE-CFE (15 wt. %) + 80 wt. % PZT + 5 | NA | NA | NA | NA | NA | NA |

TABLE 3-continued

Mechanical properties measured from nano-indentation

| Sample | Modulus (GPa) | STDEV | Range (Mod) | Hardness (GPa) | STDEV | Range(Hard) |
|---|---|---|---|---|---|---|
| wt. % EVA EVA (20 wt. %) + 80 wt. % PZT | 0.75 | 0.36 | 0.25-1.2 | 0.02 | 0.01 | 0.02-0.03 |

The hardness and modulus of the composite film decreased after addition of EVA as shown above in table 3.

Example 4

Scratch/Mar Studies

Tests were conducted on scratch resistance on three sample of film. The first was PVDF-TrFE-CFE (20 wt. %)+80 wt. % PZT. The second was CFE (19 wt. %)+80 wt. % PZT+1 wt. % EVA. The third sample comprised PVDF-TrFE-CFE (15 wt. %)+80 wt. % PZT+5 wt. % EVA. These tests showed that the scratch depth was reduced by as much as 20%.

The piezoelectric charge constant, d33, for PVDF-TrFE-CFE blended with 50 wt. % PZT is around 55 pC/N, while for compositions with 1-5 wt. % EVA added to the blend, the d33 is in the range of 48-50 pC/N. Thus, addition of EVA is not seen to compromise the d33 value seen in PVDF-TrFE-CFE composite.

The final films developed showed a combination of benefits over the prior art from the two different polymers (i.e., EVA and PVDF-TrFE-CFE) blended as a polymer matrix with the piezoelectric fillers like PZT, BaTiO$_3$, etc. added up to greater than 80-90 wt. %.

While it has generally been shown that the EVA is first combined with the fluorinated polymer before adding the piezoelectric additive, the three components can in fact be combined in any order, or all at once.

While the invention has been shown in some of its forms, it should be apparent to those skilled in the art that it is not so limited, but is susceptible to various changes and modifications without departing from the scope of the invention based on experimental data or other optimizations considering the overall economics of the process. Accordingly, it is appropriate that the appended claims be construed broadly and in a manner consistent with the scope of the invention.

The invention claimed is:

1. A piezoelectric thin film comprising:
a fluorinated polymer;
ethylene-vinyl acetate (EVA), the EVA and fluorinated polymer comprising a polymer matrix, and,
a piezoelectric additive, the piezoelectric thin film having a thickness in a range of 30-120 microns.

2. The piezoelectric thin film of claim 1, wherein the fluorinated polymer is a member of the polyvinyl difluoride (PVDF) family.

3. The piezoelectric thin film of claim 2, wherein the PVDF is PVDF-TrFE-CFE.

4. The piezoelectric thin film of claim 3, wherein the piezoelectric additive comprises one or more selected from the group of: PZT, BaTiO$_3$ and KNLN.

5. The piezoelectric thin film of claim 3, wherein the piezoelectric additive comprises 10-70 wt. % of said thin film.

6. The piezoelectric thin film of claim 3, wherein the piezoelectric additive comprises 70-90 wt. % of said thin film.

7. The piezoelectric thin film of claim 3, wherein the piezoelectric additive comprises one or more selected from the group of: PZT, BaTiO$_3$ and KNLN; and, wherein the weight percentage of EVA mixed with the fluorinated polymer is 1-99 wt. %.

8. The piezoelectric thin film of claim 7, wherein the weight percentage of EVA in the polymer matrix is 1-5 wt. %.

9. The piezoelectric thin film of claim 3, wherein the piezoelectric additive comprises 10-70 wt. % of said thin film, and, wherein the weight percentage of EVA in the polymer matrix is 1-99 wt. %.

10. The piezoelectric thin film of claim 9, wherein the weight percentage of EVA in the polymer matrix is 1-5 wt. %.

11. The piezoelectric thin film of claim 2, wherein the piezoelectric additive comprises one or more selected from the group of: PZT, BaTiO$_3$ and KNLN.

12. The piezoelectric thin film of claim 2, wherein the weight percentage of EVA in the polymer matrix is 1-99 wt. %.

13. The piezoelectric thin film of claim 3, wherein the weight percentage of EVA in the polymer matrix is 1-99 wt. %.

14. The piezoelectric thin film of claim 1, wherein the piezoelectric additive comprises one or more selected from the group of: PZT, BaTiO$_3$ or KNLN.

15. The piezoelectric thin film of claim 1 wherein the weight percentage of EVA in the polymer matrix is 1-99 wt. %.

16. The piezoelectric thin film of claim 15 wherein the weight percentage of EVA in the polymer matrix is 1-5 wt. %.

17. The piezoelectric thin film of claim 1, wherein the piezoelectric additive comprises 10-70 wt. % of said thin film.

18. The piezoelectric thin film of claim 1, wherein the piezoelectric additive comprises 70-90 wt. % of said thin film.

19. A piezoelectric thin film comprising:
PDVF-TrFE-CFE;
ethylene-vinyl acetate (EVA), wherein the EVA and PDVF-TrFE-CFE together comprising a polymer matrix, the EVA comprising 1-5 wt. % of the polymer matrix; and
a piezoelectric additive, wherein the piezoelectric additive comprising 70-90 wt. % of the thin film, the piezoelectric thin film having a thickness in a range of 30-120 microns.

20. A device comprising:
a piezoelectric composition, the composition comprising a fluorinated polymer, ethylene-vinyl acetate (EVA), the EVA and fluorinated polymer comprising a polymer matrix and a piezoelectric additive, wherein the composition is in the form of a thin film with a thickness in a range of 30-120 microns;

wherein the device is selected from a group comprising a sensor, a transducer, an actuator or a wearable device.

* * * * *